United States Patent [19]

Moritz et al.

[11] Patent Number: 4,659,650

[45] Date of Patent: Apr. 21, 1987

[54] PRODUCTION OF A LIFT-OFF MASK AND ITS APPLICATION

[75] Inventors: Holger Moritz; Gerd Pfeiffer, both of Holzgerlingen, Fed. Rep. of Germany

[73] Assignee: International Business Machines Corporation, Armonk, N.Y.

[21] Appl. No.: 840,344

[22] Filed: Mar. 17, 1986

[30] Foreign Application Priority Data

Mar. 22, 1985 [EP] European Pat. Off. ............ 85103349

[51] Int. Cl.$^4$ ..................... B05D 5/12; H01L 21/312
[52] U.S. Cl. ....................................... 430/313; 427/86; 427/87; 427/91; 427/99; 430/315; 430/326; 430/328; 430/329; 430/330; 430/331
[58] Field of Search ................... 427/99, 91, 86, 87; 430/326, 328, 329, 331, 330, 313, 315

[56] References Cited

U.S. PATENT DOCUMENTS

| | | | |
|---|---|---|---|
| 4,104,070 | 8/1978 | Moritz et al. | 96/36 |
| 4,378,383 | 3/1983 | Moritz | 427/96 |
| 4,439,516 | 3/1984 | Cernigliaro | 430/326 |
| 4,443,533 | 4/1984 | Panico | 430/328 |
| 4,567,132 | 1/1986 | Fredericks | 430/328 |

OTHER PUBLICATIONS

C. J. Hamel, W. J. Schuele and E. G. Symula, "Negative-Acting Positive Photoresist", IBM Technical Disclosure Bulletin, vol. 23, No. 5, Oct. 1980.
Solid State Science & Technology, Nov. 1979, "Developer Temperature Effects of E-Beam and Optically Exposed Positive Photoresist", pp. 20–26.
Journal of the Electrochemical Society, Jun. 1982, "Deep U.V. Hardening of Positive Photoresist Patterns", p. 1379.
Xerox Disclosure Journal, Jul./Aug. 1982, p. 293.
IBM J. Res. Develop., May 1982, "A VLSI Bipolar Metallization Design with Three Level Wiring", pp. 362–371.
IBM TDB Dec. 1983, p. 3972.
IBM TDB Oct. 1980, p. 1839.
IBM TDB Oct. 1983, p. 2679.
IBM TDB Feb. 1982, p. 4726.
J. Electrochem. Soc. Solid–State Science and Technology, vol. 116, No. 11, The Use of Metalorganics in the Preparation of Semiconductor Materials, Jun. 1982.

*Primary Examiner*—John D. Smith
*Assistant Examiner*—V. D. Dang
*Attorney, Agent, or Firm*—Wolmar J. Stoffel

[57] ABSTRACT

A positive resist containing a weak base and polyvinyl phenol as a film forming component is deposited on a substrate, subsequently exposed imagewise, cured, blanket exposed and developed in a KOH solution at temperatures of less than 10° C. The resist pattern thus obtained is exposed to light having a wavelength ranging from 300 to 320 nm and finally heat-treated at temperatures ranging from 150° to 280° C. The finished lift-off mask is dimensionally stable at temperatures of ≦280° C. and does not emit liquid or volatile components when heated.

During application of the lift-off mask, a material is blanket vapor deposited at a substrate temperature ranging from about 160° to 250° C. on the resist pattern having openings with overhanging walls. Subsequently, the resist pattern is dissolved in a sodium metasilicate solution, causing the material vapor deposited thereon to be lifted off, with the material deposited on the substrate directly remaining.

The lift-off mask is particularly suitable for generating conductor patterns on semiconductor substrates if low and uniform contact resistances between the conductor and the semiconductor material and a high degree of pattern accuracy and packing density are required.

11 Claims, No Drawings

PRODUCTION OF A LIFT-OFF MASK AND ITS APPLICATION

The invention concerns a method for producing a lift-off mask, wherein a positive resist containing a weak base is deposited on a substrate, exposed imagewise, cured, blanket exposed and developed, and an application of the mask thus produced.

Lift-off masks are used in particular to generate conductor patterns. For this purpose metal is blanket vapor deposited on the lift-off mask whose layout suits the negative of the desired conductor pattern, and subsequently the mask is dissolved in a suitable solvent, removing the overlying metal, so that only the metal deposited in the mask openings remains.

It is absolutely essential that the walls in the openings of the lift-off mask be overhanging, as otherwise the vapor deposited metal would completely cover the resist pattern from the top and side and prevent the solvent from attacking the lift-off mask.

Methods for producing lift-off masks meeting this requirement are described, for example, in the article "A VLSI bipolar metallization design with three-level wiring and area array solder connections" by L. J. Freed et al, published in IBM Journal of Research and Development, Vol. 26, No. 3, May 1982, p. 362, and in German Pat. No. 25 29 054. The method described in the afore-mentioned article provides for layers to be chemically vapor deposited (CVD) and to be subjected to reactive ion etching (RIE), so that the apparatus required is substantial. The mask thus obtained consists of four layers. The lift-off mask produced by the method described in German Pat. No. 25 29 054 consists of only one layer, and the means required are few. The approach of the patented method is such that a positive resist material containing 1-hydroxyethyl-2-alkylimidazoline is deposited on a substrate, exposed imagewise by actinic radiation, heated to an adequate temperature for a sufficiently long time, uniformly exposed to actinic radiation and finally developed. In the article "Image Reversal: The Production of a Negative Image in a Positive Photoresist", S. A. MacDonald et al point out that the patented method also works if in lieu of 1-hydroxyethyl-2-alkylimidazoline another weak base, such as imidazole or triethanolamine, is used.

Known lift-off masks are problematical because of their low temperature resistance which causes the resist pattern to flow, i.e., to change its dimensions, if the metal is vapor deposited at too high a temperature. To avoid such dimensional changes, the deposition temperature must not exceed 120° C. for the lift-off mask produced by the patented method. A relatively high deposition temperature is desirable, however, if the vapor deposited metal is to conductively contact regions of a substrate consisting of, say, semiconductor material, and if it is essential that the contact resistance be low and uniform. It is true that the lift-off mask produced by the method described by Freed et al withstands deposition temperatures ranging from 150° to 160° C., but these temperatures are still insufficient, not to mention the additional disadvantage that both the method and the mask structure are complex.

SUMMARY OF THE INVENTION

It is the object of the invention to provide a simple method for producing a lift-off mask which, in addition to having the advantages of known lift-off masks, is temperature-resistant, and an application of the mask thus produced.

This object is accomplished in a method of producing a lift-off mask, wherein a positive resist containing a weak base is deposited on a substrate, exposed imagewise, cured, blanket exposed and developed, the improvement characterized in that a positive resist is used containing polyvinyl phenol as a film forming component, that development is effected in an alkaline solution at a temperature less than 10° C., that a development the resist pattern is exposed using light having a wavelength ranging from 300 to 320 nm, and subsequently heat treated at a temperature in the range of 150° to 280° C. The steps of the method according to the invention interact in a non-obvious and as yet not fully understood manner, yielding a lift-off mask whose dimensions are no longer changed once its pattern has been defined. Such a mask consists of a single layer, has overhanging walls in its openings and is dimensionally stable even at higher temperatures. The simplicity of the method and the mask produced thereby advantageously affects not only the production cost but also the defect density.

The temperatures used for temperature treatment following development and exposure range from 150° to 280° C. and are preferably about 250° C. At temperatures of less than 150° C., solvent and water residues remain in the mask, whereas at temperatures above 280° C. the mask material starts to sublimate.

On the mask produced according to the invention, metal may be vapor deposited at temperatures of, say, 200° C. without the mask dimensions changing. This permits forming low and uniform contact resistances and using the mask whenever densely packed circuits with very narrow and closely adjacent conductors are to be produced at high yield. Apparently temperature treatment after development and exposure ensures that, in contrast to the mask produced by the patented method, no metal seams are detectable along the conductors after lift-off of the mask produced according to the invention. Such metal seams though influencing the capacity of the conductors do not affect their conductivity.

DETAILED DESCRIPTION

The production of the lift-off mask and its application according to the invention will be described in detail below.

During the production of the lift-off mask, the positive resist is initially mixed with the weak base. The weak base used for the method described below is 1-hydroxyethyl-2-alkylimidazoline. However, as previously mentioned, the method does not only work with this compound. Suitable positive resist materials contain polyvinyl phenol and a photoactive diazonaphtoquinone inhibitor. A positive resist fitting that description is marketed, for instance, by Shipley Company, Inc., Newton, Mass, U.S.A., under the type name 23M, whereas alkylimidazoline is distributed by Mona Ind., Inc., Paterson, N.J., U.S.A., under the trade name Monazoline C. A predetermined quantity of Monazoline C is dissolved in a small quantity of solvent, such as cellosolveacetate, and then mixed with a quantity of the positive resist which is such that the mixture contains between about 1 and about 3 g of Monazoline C per 100 ml.

For generating the resist layer, a small quantity of the mixture is applied to the substrate, on which the lift-off mask is to be generated, preferably by spinning. The thickness of the layer is preferably between about 1.5 and 6 μm and is controlled by the speed of the spinning table.

Subsequently, the resist layer is precured at temperatures ranging from about 85° to about 105° C. for about 10 to about 20 minutes and then exposed through a mask pattern, using UV-light or electrons. During exposure, the photoactive inhibitor is decomposed in the regions not covered by the exposure mask, decomposition proceeding from the resist surface.

The resist film exposed through the mask pattern is heated at temperatures ranging form about 95° to about 110° C. for about 10 to 60 minutes. During heating, Monazoline C reacts with polymer molecules of the resin in the previously exposed resist regions where the inhibitor was decomposed. As a result, cross-linkage occurs, causing the resist regions that were previously made soluble to resume an unsoluble state. For temperature treatment, which is generally performed in a nitrogen atmosphere, a relatively simple oven adjustable to ±1° C. is used.

After temperature treatment, the resist layer is blanket exposed, preferably using a UV-lamp of high intensity, such as a 200 W mercury maximum pressure lamp. A reasonable exposure time for an about 2 μm thick resist layer is about 50 seconds if a 200 W lamp used. Blanket exposure causes the inhibitor to decompose in the previously unexposed regions. This is followed by a development step at temperatures below 10° C., preferably between 0° and 10° C., using a KOH solution with a normality ranging from 0.05 to 0.2. This leads to the regions exposed through the exposure pattern to be retained, while the regions masked in the first exposure step are removed. The resultant hole pattern in the resist layer resembles the non-transparent regions in the mask pattern. The time required for developing an about 2 μm thick resist layer is of the order of 10 minutes.

The walls in the openings of the generated resist pattern are overhanging as required. However, heating the resist pattern to temperatures above 140° C. would cause its edges to flow. To prevent this, the resist pattern is blanket exposed, using a radiation whose wavelength ranges from 300 to 320 nm and an exposure energy of $\leq 60$ Joules/cm$^2$. Exposure leads to a cured surface film on the resist pattern. It is essential that the aforementioned wavelength range be observed, because at shorter wavelengths the absorption of the radiation in the resist would be so strong that the cured surface film would be very thin, while longer wavelengths would fail to produce the curing required. After exposure, the resist pattern can be heated to temperatures ranging from 150° to 300° C., without its edges starting to flow. Exposure is followed by a temperature treatment step in the afore-mentioned temperature range, which serves to remove any solvent and water residues still existing in the resin. This completes the temperature-resistant lift-off mask.

The lift-off mask is favourably produced to the following specification.

5 g Monazoline C are dissolved in 25 ml cellosolveacetate, then 225 ml positive resist 23M are added to the solution thus obtained. Before further use, the required quantity of this positive resist mixture is passed through a filter.

Then the positive resist mixture is spun at 2500 rpm for 30 seconds onto the substrate, forming a 2.0 to 2.1 μm thick layer. Subsequently, the resist layer is dried for 20 minutes at 85° C.

The resist layer is exposed through a mask, using light having a wavelength of 436 nm. The light source may be, for example, a 350 W mercury maximum pressure lamp marketed by Osram under the type name HBO 350. The optimum exposure time is determined by exposing several probes for differently long periods of time, by measuring the mask dimensions obtained after development and by comparing them with the dimensions of the exposure mask pattern. The optimum exposure time is the time at which the pattern of the non-transparent regions of the exposure mask fully coincides with the pattern of the openings in the generated resist pattern. After imagewise exposure, the resist layer is subjected to temperature treatment in a nitrogen atmosphere at 100° C. for about 50 minutes. Then, the resist layer is blanket exposed, using for example, a mercury maximum pressure lamp marketed by Osram under the type name HBO 200.

This is followed by a development step in a 0.13 normal KOH solution at a temperature of between about 5° and about 7° C. for 10 minutes.

The generated resist pattern is exposed to light having a wavelength of 308 nm, using an Xe-Cl-filled Excimer laser at an exposure energy density of the order of 60 Joules/cm$^2$.

Then the resist pattern is cured in an oven in a nitrogen atmosphere, preferably heating the pattern to a temperature of about 250° C. During this step, there is no flowing of the resist edges.

The lift-off mask thus obtained has openings whose walls are overhanging and onto which metal may be vapor deposited at 250° C. without any dimensional changes.

The application according to the invention of the lift-off mask thus produced will be described below with reference to an example concerning the production of conductor patterns on semiconductor substrates. For this purpose, the temperature resistance of the lift-off mask is important. It is pointed out, however, that while the lift-off mask will be described with reference to the afore-mentioned example it is not limited to that example but may also be used to generate conductor patterns on, say, ceramic modules or to generate patterns other than conductor patterns. Patterns may be generated from any material that may be deposited by methods providing for all material particles to impinge on the substrate from the same direction, such methods being, for instance, vapor deposition and cathode sputtering.

The semiconductor substrate on which a conductor pattern is to be generated is generally covered with an insulating layer. The semiconductor devices produced in the substrate in the preceding steps are connected to each other and to peripheral connectors by the conductor pattern to be generated. For that purpose, contact holes to the semiconductor substrate must be etched into the insulating layer before depositing the conductor material. These contact holes are either etched, using the lift-off mask as an etch mask (such a method being described, for example, in the European Patent Application No. 00 57 738), or are already existing if the resist layer has been deposited at the start of lift-off mask formation. The subsequent description proceeds from the latter case, i.e., for describing the application according to the invention it is assumed that using the inventive method, the lift-off mask is formed on an insulating layer with contact holes which rests on a plane semiconductor substrate.

A conductive material, such as a metal, is blanket vapor deposited on the lift-off mask perpendicularly to the surface of the semiconductor substrate. For that purpose, the substrate is heated to a temperature ranging from about 160° to 250° C. Vapor deposition continues until the deposited material, say, an aluminium or copper alloy, is about 1 μm, i.e., about half as thick as the lift-off mask. The overhanging walls in the openings of the lift-off mask and the deposition method prevent the deposition of material on the walls of the openings, so that the solvent for dissolving the lift-off mask is capable of freely attacking the latter from the side. After metal deposition at the relatively high temperature mentioned, the lift-off mask cannot be dissolved in conventional organic solvents. It has been found, however, that the lift-off mask material dissolves in an aqueous sodium metasilicate ($NaSiO_3 \cdot xH_2O$) solution. The solution is used at room temperature and should be $\leq 0.25$ molar. As the lift-off mask is being dissolved, the conductive material deposited on the mask is lifted off. What remains is the conductive material deposited on the insulating layer and in the contact holes, respectively, which represents the desired conductor pattern. Any resist residues still remaining on the substrate after the lift-off step can be readily removed in an oxygen plasma.

The dimensions of the generated conductor pattern correspond within small tolerances to the desired pattern. This also holds with extremely good reproducibility if the conductor pattern is densely packed, i.e., if very narrow conductors ($\geq 1$ μm) are arranged closely adjacent to each other ($\geq 1$ μm). The contact resistances in the contact holes are low and uniform. Metal seams along the conductors were not found.

Densely packed conductor patterns on wafers with the aforementioned advantageous characteristics have been produced, using, for example, the following step sequence.

On several semiconductor wafers covered with an insulating layer provided with contact holes lift-off masks were produced according to the above-described method. Then an about 1 μm thick Al/Cu layer was blanket vacuum deposited at a wafer temperature of about 200° C. The vapor deposited wafers were treated at room temperature in an about 0.25 molar aqueous sodium metasilicate solution for 10 minutes, leading to the removal of the lift-off mask and the Al/Cu layer deposited thereon and to the formation of the conductor pattern on the insulating layers and in the contact holes. The wafers thus treated were inspected when small resist residues were found on two of the wafers. For removing these residues, the two wafers were treated in a plasma etch unit (marketed by LFE Corporation under the type name 301) at an oxygen pressure of about 1.333 mbar and an energy of 150 W for 10 minutes. During the subsequent inspection, the two wafers were also found free from resist residues, and the conductor patterns generated on them had the above-mentioned favourable characteristics. In particular the conductor patterns on all processed wafers had the same dimensions.

We claim:

1. Method for producing a lift-off mask, wherein a positive resist containing a weak base is deposited on a substrate, exposed imagewise, cured, blanket exposed and developed, characterized in that a positive resist is used containing polyvinyl phenol as a film forming component, that development is effected in an alkaline solution at a temperature of $<10°$ C., that after development, the resist pattern is exposed, using light having a wavelength ranging from 300 to 320 nm, and subsequently heat-treated at a temperature ranging from 150° to 280° C.

2. Method according to claim 1, characterized in that development is effected at temperatures ranging from 0° to 10° C., using a KOH solution whose normality ranges from 0.05 to 0.2.

3. Method according to claim 2, characterized in that development is effected in a KOH solution having a normality of 0.13.

4. Method according to claim 3, characterized in that the resist pattern is exposed to light having a wavelength of 308 nm.

5. Method according to claim 4, characterized in that the resist pattern is exposed at an energy density of $\geq 60$ $mJ/cm^2$.

6. Method according to claim 5, characterized in that 1-hydroxyethyl-2-alkylimidazoline is used as a weak base.

7. An improved method for producing a conductor pattern on a substrate comprising
   producing a lift-off mask by depositing on said substrate a positive resist, containing a weak base and polyvinyl phenol as a film forming component,
   exposing the resist imagewise,
   developing the exposed resist in an alkaline solution at a temperature of $<10°$ C.,
   exposing the developed resist to light of a wavelength of from 300 to 320 nm,
   heat treating the resist at a temperature in the range of 150° C. to 280° C.
   depositing a blanket layer of conductive material over said lift-off mask,
   dissolving the lift-off mask in an aqueous sodium metasilicate solution thereby dissolving the lift-off mask and causing the conductive material on the mask to be lifted off.

8. The method of claim 7 wherein said aqueous sodium metasilicate sodium has a concentration of $\leq 0.25$ molar.

9. The method of claim 7 wherein said substrate is a semiconductor substrate provided with an insulating layer with contact holes, and said lift-off mask is deposited on said insulating layer.

10. The method of claim 7 wherein said layer of conductive material is a layer of metal that is vapor deposited at a substrate temperature in the range of 160° to 250° C.

11. The method of claim 7 wherein said weak base is 1-hydroxyethyl-2-alkylimidazaline.

* * * * *